(12) United States Patent
Gdor et al.

(10) Patent No.: US 12,105,431 B2
(45) Date of Patent: Oct. 1, 2024

(54) ANNULAR APODIZER FOR SMALL TARGET OVERLAY MEASUREMENT

(71) Applicant: KLA Corporation, Milpitas, CA (US)

(72) Inventors: Itay Gdor, Halevi (IL); Yuval Lubashevsky, Haifa (IL); Alon Alexander Volfman, Migdal Haemek (IL); Daria Negri, Haifa (IL); Yevgeniy Men, Milpitas, CA (US); Elad Farchi, Pardes Hana-Karkur (IL)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/584,335

(22) Filed: Jan. 25, 2022

(65) Prior Publication Data
US 2023/0236113 A1 Jul. 27, 2023

(51) Int. Cl.
*G03F 7/00* (2006.01)
*G01N 21/21* (2006.01)
*H01L 21/66* (2006.01)

(52) U.S. Cl.
CPC ....... *G03F 7/70633* (2013.01); *G01N 21/211* (2013.01); *G03F 7/706849* (2023.05); *H01L 22/12* (2013.01)

(58) Field of Classification Search
CPC .... G02B 27/09; G02B 27/0988; G02B 27/58; G01N 21/88; G01N 21/8803; G01N 21/8806; G01N 21/9501; G01N 21/9503; G01N 21/9505; G01N 2021/212; G01N 2021/213; G01N 2021/214; G01N 2021/215; G01N 21/211; G01B 11/02; G01B 11/022; G01B 11/024; G01B 11/06; G01B 11/0616; G01B 11/0633; G01B 11/0641; G01B 11/065; G01B 11/08; G01B 11/14; G01B 11/24; G01B 11/26; G01B 11/27; G01B 11/272; G01B 11/28; G01B 11/285; G01B 11/30; G01B 11/303; G01B 11/306; H01L 22/12; G03F 7/70616; G03F 7/70625; G03F 7/70633; G03F 7/70641; G03F 7/7065; G03F 7/706849

See application file for complete search history.

(56) References Cited

U.S. PATENT DOCUMENTS

| | | | |
|---|---|---|---|
| 5,859,424 A | 1/1999 | Norton et al. | |
| 7,030,978 B2 * | 4/2006 | Guetta | G01N 21/8422 356/237.5 |
| 7,471,435 B2 * | 12/2008 | Modavis | G02B 27/58 359/227 |

(Continued)

FOREIGN PATENT DOCUMENTS

WO    WO-2021016407 A1 *  1/2021 ........... G01B 11/272

OTHER PUBLICATIONS

WIPO, International Search Report for International Application No. PCT/US2022/053301, Apr. 19, 2023.

(Continued)

*Primary Examiner* — Gordon J Stock, Jr.
(74) *Attorney, Agent, or Firm* — Hodgson Russ LLP

(57) ABSTRACT

Metrology is performed on a semiconductor wafer using a system with an apodizer. A spot is formed on the semiconductor wafer with a diameter from 2 nm to 5 nm. The associated beam of light has a wavelength from 400 nm to 800 nm. Small target measurement can be performed at a range of optical wavelengths.

9 Claims, 6 Drawing Sheets

(56) References Cited

U.S. PATENT DOCUMENTS

| | | | | |
|---|---|---|---|---|
| 7,619,735 | B2* | 11/2009 | Milshtein | G01N 21/8806 |
| | | | | 356/340 |
| 7,724,370 | B2* | 5/2010 | Mos | G03F 7/70633 |
| | | | | 430/22 |
| 8,848,186 | B2* | 9/2014 | Kandel | G01B 11/24 |
| | | | | 356/399 |
| 9,645,093 | B2* | 5/2017 | Sullivan | G02B 27/58 |
| 9,784,987 | B2* | 10/2017 | Hill | G03F 7/70633 |
| 10,006,865 | B1 | 6/2018 | Shaughnessy et al. | |
| 10,101,676 | B2* | 10/2018 | Fu | G03F 9/7046 |
| 10,197,389 | B2 | 2/2019 | Levinski et al. | |
| 11,164,307 | B1* | 11/2021 | Feler | G06T 7/001 |
| 2002/0018217 | A1 | 2/2002 | Weber-Grabau et al. | |
| 2011/0032535 | A1* | 2/2011 | Liesener | G03F 7/70633 |
| | | | | 356/511 |
| 2013/0321810 | A1* | 12/2013 | Wang | G03F 7/70625 |
| | | | | 356/369 |
| 2015/0355554 | A1* | 12/2015 | Mathijssen | G03F 9/7046 |
| | | | | 356/614 |
| 2018/0003630 | A1* | 1/2018 | Grunzweig | G03F 7/70633 |
| 2018/0120714 | A1* | 5/2018 | Zijp | G03F 7/70641 |
| 2018/0180406 | A1 | 6/2018 | Sapiens et al. | |
| 2018/0301385 | A1* | 10/2018 | Ittah | H01L 22/12 |
| 2019/0086201 | A1* | 3/2019 | Den Boef | G03F 7/705 |
| 2020/0057387 | A1 | 2/2020 | Pandey et al. | |
| 2020/0124408 | A1* | 4/2020 | Hill | G01B 11/272 |
| 2020/0192230 | A1* | 6/2020 | Sokolov | G03F 7/70633 |
| 2021/0372784 | A1* | 12/2021 | Hill | G01B 11/272 |

OTHER PUBLICATIONS

WIPO, Written Opinion of the International Searching Authority for International Application No. PCT/US2022/053301, Apr. 19, 2023.
Adel et al., "Diffraction Order Control in Overlay Metrology: A Review of the Roadmap Options," Proc. of SPIE, 2008, 692202-1 to 692202-19, vol. 6922.

* cited by examiner

ANNULAR APODIZER FOR SMALL TARGET OVERLAY MEASUREMENT

FIELD OF THE DISCLOSURE

This disclosure relates to semiconductor metrology.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it maximizes the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etching, deposition, and ion implantation. An arrangement of multiple semiconductor devices fabricated on a single semiconductor wafer may be separated into individual semiconductor devices.

Metrology processes are used at various steps during semiconductor manufacturing to monitor and control the process. Metrology processes are different than inspection processes in that, unlike inspection processes in which defects are detected on wafers, metrology processes are used to measure one or more characteristics of the wafers that cannot be determined using existing inspection tools. Metrology processes can be used to measure one or more characteristics of wafers such that the performance of a process can be determined from the one or more characteristics. For example, metrology processes can measure a dimension (e.g., line width, thickness, etc.) of features formed on the wafers during the process. In addition, if the one or more characteristics of the wafers are unacceptable (e.g., out of a predetermined range for the characteristic(s)), the measurements of the one or more characteristics of the wafers may be used to alter one or more parameters of the process such that additional wafers manufactured by the process have acceptable characteristic(s).

Scatterometry overlay metrology uses the asymmetry between the intensity of the reflected +1 and −1 diffraction from a grating-over-grating structure. These gratings are placed in the layers in which overlay is measured. The light diffracted from the target is collected at the pupil plane of the metrology tool by a CCD camera. In an instance, a scatterometry overlay (SCOL) target consists of four cells, with two cells for each direction and with known added overlay shift ±f0. Relative shift between a current and previous layers due to lithography misalignment leads to symmetry breaking, which results in intensity differences between the +1 and the −1 diffraction order. Such differences can be correlated with the overlay value.

Apodizers in scatterometry can be used for on-axis illumination or off-axis illumination. Both on-axis illumination and off-axis illumination apodizers have disadvantages when measuring small targets.

On-axis illumination has limitation in the available spectral range because the diffraction direction is $\lambda$/pitch, where $\lambda$ represents a wavelength. A small target requires small pitch to have an adequate amount of bars in target so only short wavelengths can be collected by the objective without a pupil cut. To allow enough space in the pupil for diffraction order collection, the open pupil (illumination numerical aperture (NA)) is small, which generates a large spot on the target. The large spot causes target noise because the incoming light diffracts when it hits the target edge.

Off-axis illumination can be more tolerant of diffraction angles, which can enable more wavelength range. However, at least two illumination spots are needed to collect the two orders needed for overlay calculation. The illumination light interferes on the target and creates a large spot and high sensitivity for target position.

It was difficult to use the red spectrum (approximately 600 nm to 800 nm) with previous metrology tools because the red spectrum needed an off-axis apodizer. An off-axis apodizer was not suitable for some applications. Interference would occur, which would affect the difference between the pupil and the field. With small target this would result in the beam hitting the edge of the sample or even being outside the sample.

Improved systems and techniques are needed.

BRIEF SUMMARY OF THE DISCLOSURE

A method is provided in a first embodiment. The method includes generating a beam of light with a wavelength from 400 nm to 800 nm. The beam of light is directed through an apodizer. Metrology is performed on a semiconductor wafer using the beam of light. The beam of light forms a spot on the semiconductor wafer having a diameter from 2 nm to 5 nm using the apodizer.

The semiconductor wafer can include a diffraction-based overlay target.

The apodizer can define an aperture with a numerical aperture of approximately 0.2.

The wavelength can be from 400 nm to 600 nm or from 600 nm to 800 nm.

The metrology can be performed in a field plane.

The beam of light can be used in on-axis illumination or off-axis illumination.

A system is provided in a second embodiment. The system includes an illumination source that generates a beam of light, an apodizer disposed in a path of the beam of light, and a stage configured to hold a semiconductor wafer in the path of the beam of light. The illumination source generates the beam of light to have a wavelength from 400 nm to 800 nm. The beam of light is configured to form a spot on the semiconductor wafer having a diameter from 2 nm to 5 nm using the apodizer.

The wavelength can be from 400 nm to 600 nm or from 600 nm to 800 nm.

The metrology can be performed in a field plane.

The apodizer can define an aperture with a numerical aperture of approximately 0.2.

The apodizer can be disposed proximate a pupil plane.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Annular apodization can be used for measuring a small diffraction grating target in a SCOL metrology tool. Embodiments disclosed herein enable small target measurement at a range of optical wavelengths. In particular, the small target can have a diffraction-based overlay (DBO) design.

Figure 8:
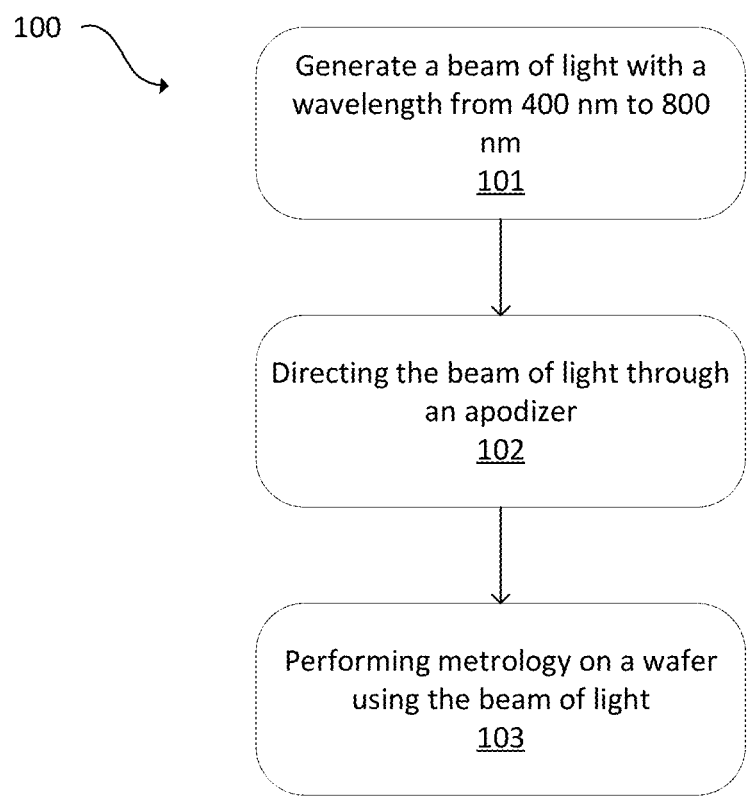
FIG. 8 is a flowchart of an embodiment of a method in accordance with the present disclosure.

In the method 100 of FIG. 8, a beam of light is generated with a wavelength from 400 nm to 800 nm at 101. For example, the wavelength used in the method 100 can be from 400 nm to 600 nm or from 600 nm to 800 nm. In particular, the wavelength can be or can include a red wavelength, which is approximately 600 nm to 800 nm (e.g., 620 nm to 750 nm). A wavelength less than 400 nm or greater than 800 nm may be difficult to use effectively because the light source may have low intensity at these ranges and anti-reflection coatings within the system may affect results.

Figure 1:
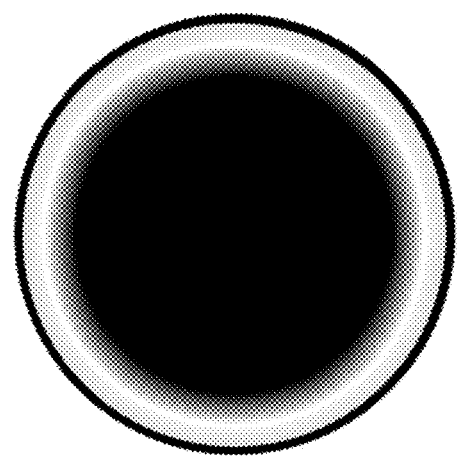
FIG. 1 is an embodiment of an annular apodizer disk in accordance with the present disclosure.

The beam of light is directed through an apodizer at 102. For example, an embodiment of an annular apodizer disk is illustrated in FIG. 1. The apodizer defines an aperture with an NA of approximately 0.2, but the NA can be ±5%, ±10%, or ±25% of this value.

The apodizer can have a large aperture that results in a tight spot of the beam of light. The clear area in the center of the aperture in the collection pupil enables use of a broad range of working wavelengths for the beam of light. A larger wavelength or pitch range is enabled.

To minimize the airy ring, the apodizer edges can be refined. For example, a $\cos^2$ function can be used to reduce the spot wings and avoid the cell edges.

The annulus parameters can be chosen to best fit and/or optimized for recipe, layer, or target. A wider ring may let more light in for dark layers measurement and can generate a tighter spot. A tighter ring may allow more spectral range. The additional spectral range can enable wavelengths up to 800 nm with sufficient light.

Turning back to FIG. 8, metrology is performed on a wafer using the beam of light at 103. The beam of light forms a spot on the semiconductor wafer having a diameter from approximately 2 nm to 5 nm using the apodizer, though other diameters are possible. This diameter range for the spot can be ±5% or ±10% of the range. Spot sizes in this range were difficult to obtain in previous metrology tools because these previous metrology tools had a small NA. In general, the spot size is smaller when the NA is larger. Metrology can be performed on smaller targets if a smaller spot size is used because the spot is less likely to hit the edge or outside the target.

The method 100 may be at least partially implemented by at least one computer processor (e.g., in a metrology module). Certain embodiments include computer program products comprising a computer readable storage medium having computer readable program embodied therewith and configured to carry out the method 100.

In an instance, the method 100 includes illuminating a stationary diffractive target by a stationary illumination source. Overlay information is determined from a difference in intensity between the +1 and −1 orders.

Figure 3:
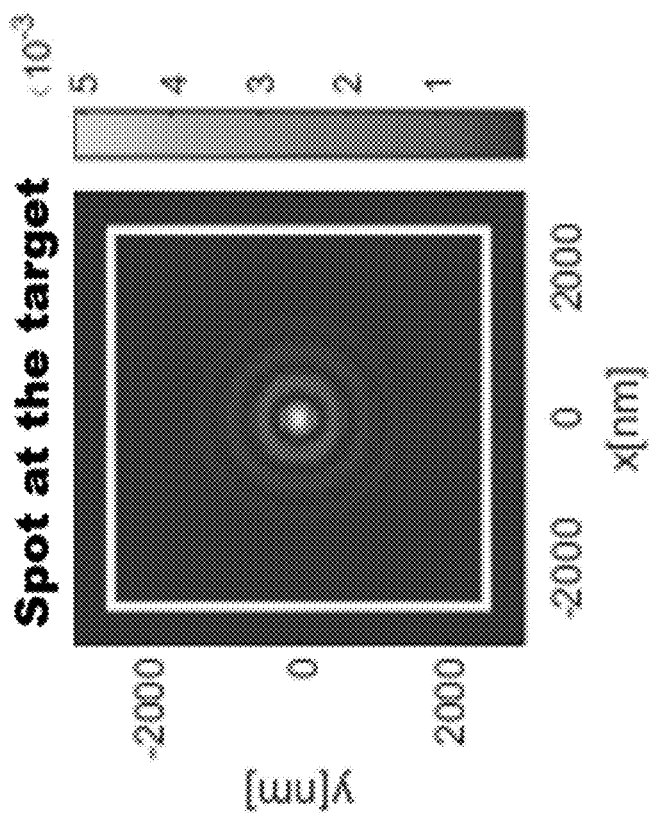
FIGS. 2 and 3 show an exemplary illumination pupil and resulting spot on the target.
Figure 2:
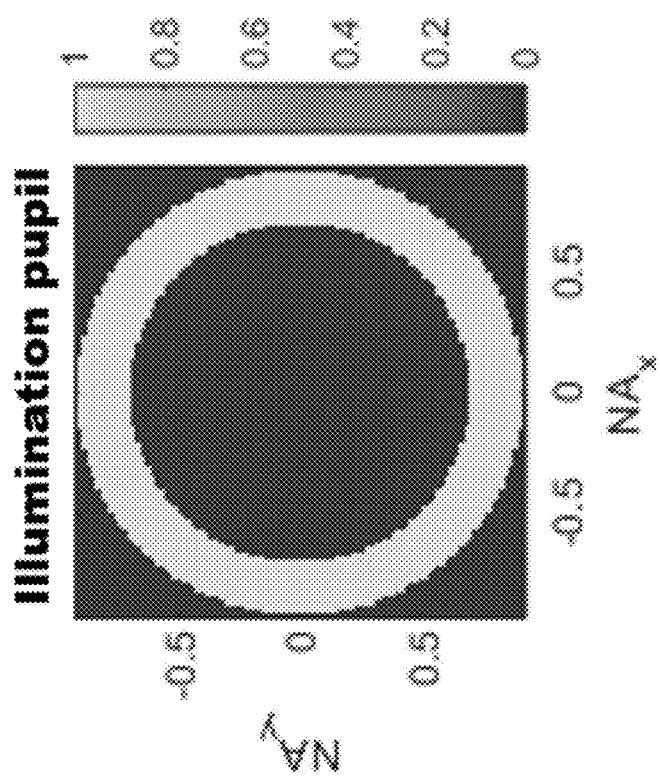

The resulted spot on the wafer is presented in FIGS. 2-3. The spot is well-localized in a 3×3 micron area even with an unavoidable array ring resulting from the annular assembly. For example, full width at half maximum (FWHM) of the spot is approximately 200 nm to 250 nm in FIG. 3.

The semiconductor wafer can include a diffraction-based overlay target. The diffraction-based overlay target has dimensions from approximately 16 μm to 16 μm. The target may be larger than the spot size so the spot does not interact with the edges of the cell.

The metrology at 103 can be performed in a field plane. The beam of light in the method 100 can be used in on-axis illumination or in off-axis illumination. The apodizer can determine if the illumination is on-axis or off-axis.

Figure 4:
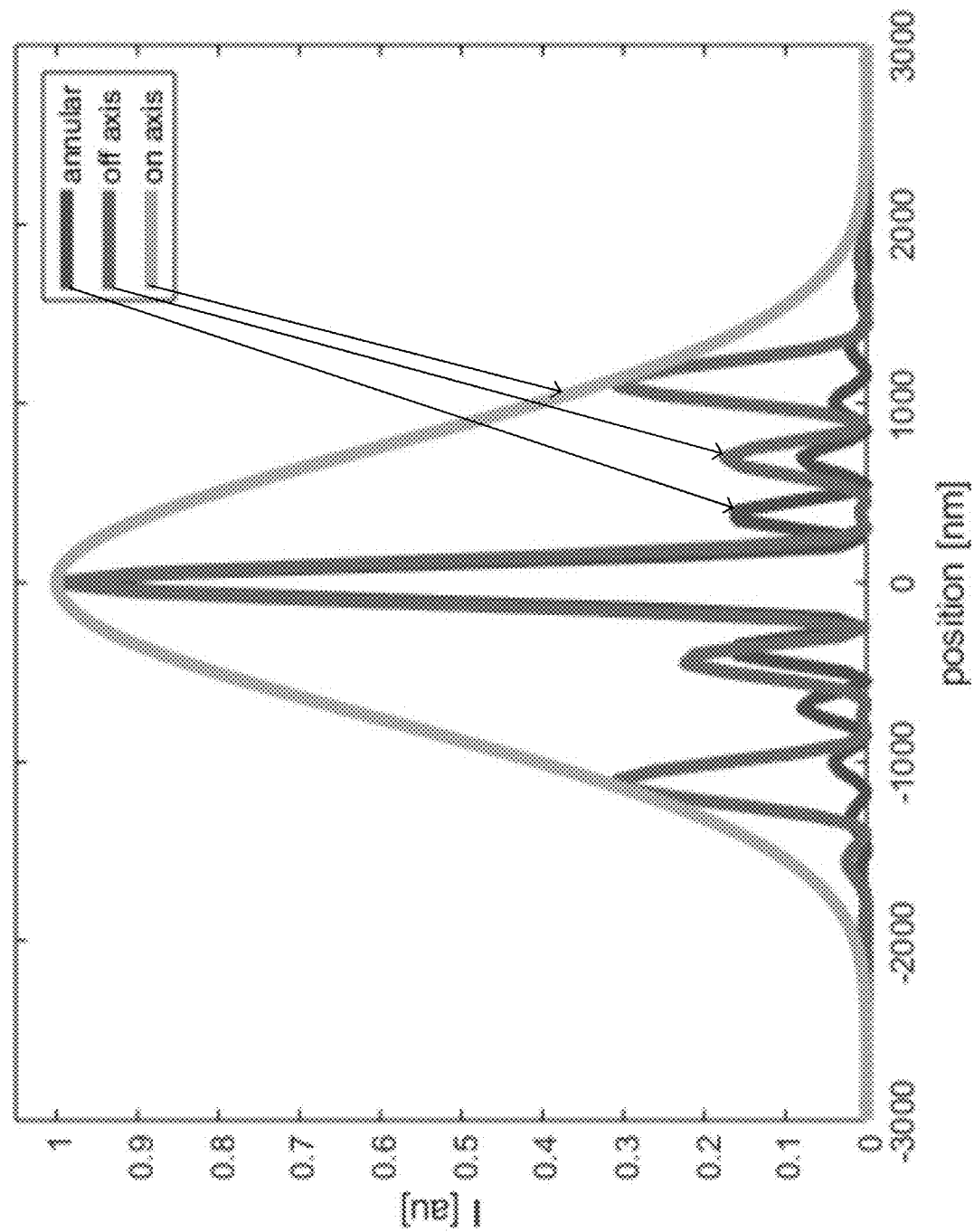
FIG. 4 shows an illumination pupil cut for annular, off-axis, and on-axis.

To compare the spot size of new annular apodizer to the traditional apodizers, FIG. 4 presents a cut in the middle of the generated spot. Intensity is shown in the vertical axis in FIG. 4. The spot from the new apodizer ("annular") as disclosed herein is better for a small target compared to previous on-axis or off-axis systems.

Figures 5, 6, 7:
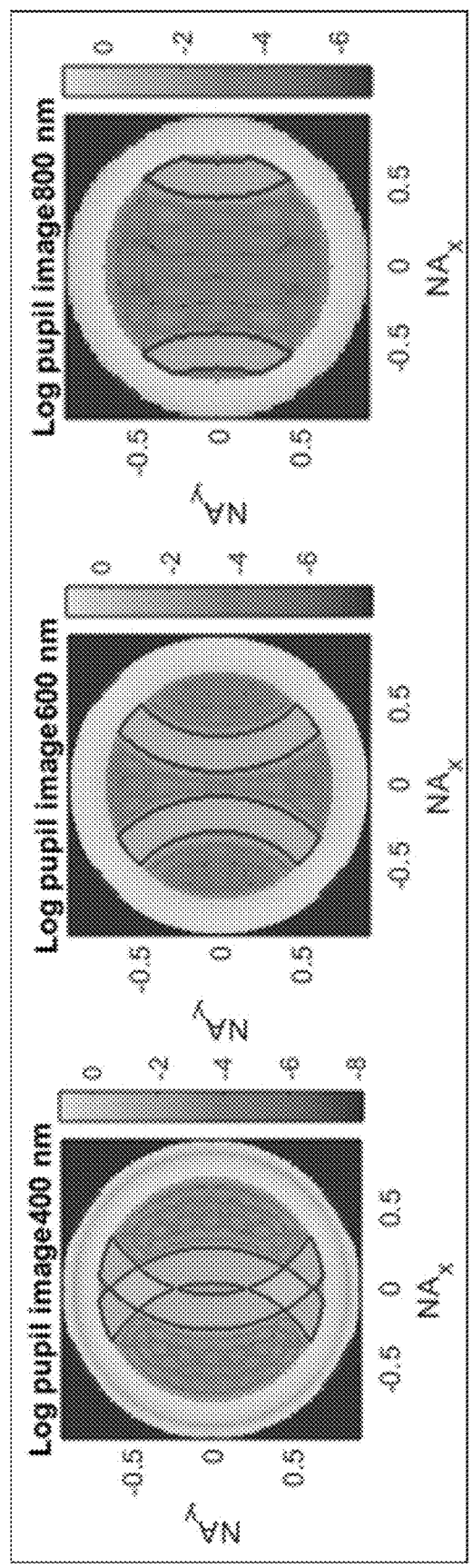
FIGS. 5-7 show pupil images for three different wavelengths (400 nm, 600 nm, and 800 nm) with outlines marking the areas from which overlay is determined.

Embodiments disclosed herein can measure overlay in a wide range of wavelengths because by using light for the edge of the pupil plane the angle that is collected can be wider than an on-axis apodizer. FIGS. 5-7 demonstrate the collection pupil in three different wavelengths throughout the whole range usable spectrum. Overlay can be measured over the whole range of wavelengths. Outlines in the inner ring mark the areas from which overlay is determined in FIGS. 5-7.

Figure 9:
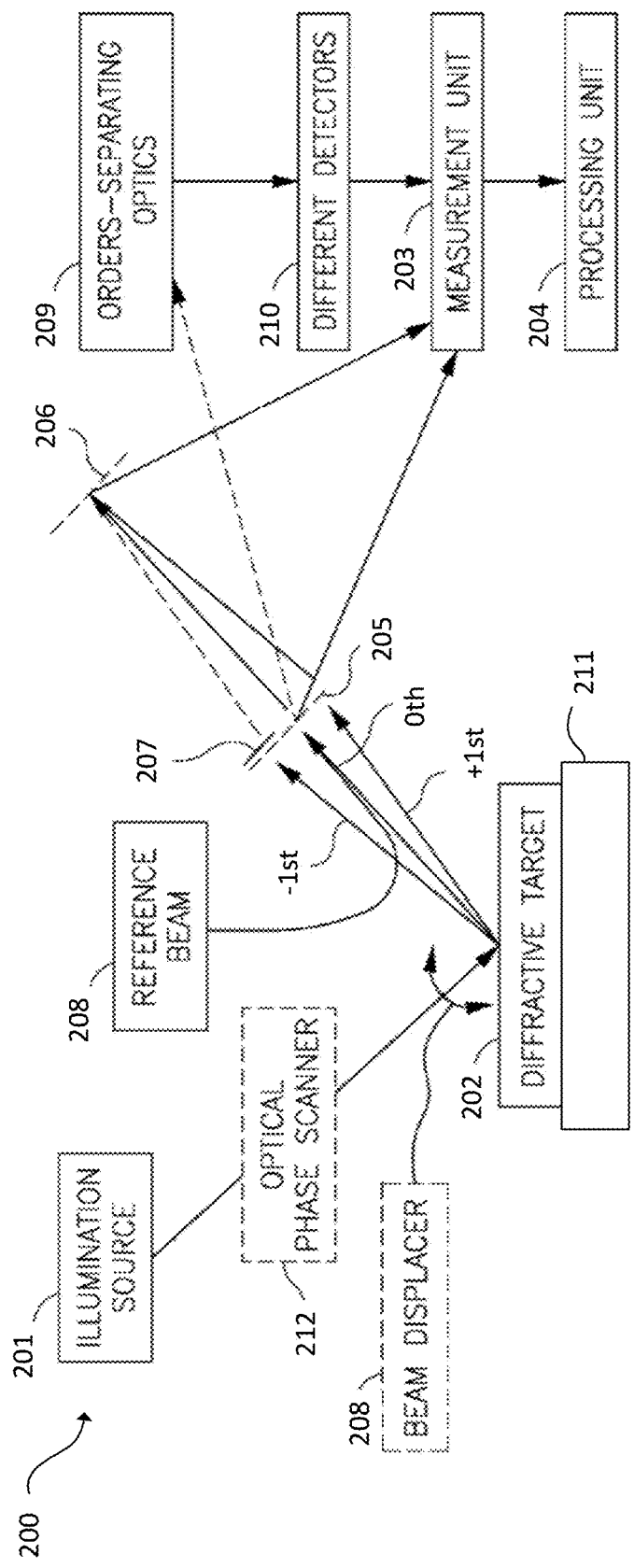
FIG. 9 is a block diagram of a system in accordance with the present disclosure.

FIG. 9 is a block diagram of a system 200, which is an exemplary metrology tool. The system 200 can be used to perform the method 100 or other embodiments disclosed herein.

FIG. 9 illustrates multiple, measurement arrangements, which may be used alternatively or complementarily. System 100 includes a stationary illumination source 201 configured to illuminate stationary diffractive target 202 on a stage 211, a measurement unit 203 configured to measure, repeatedly, a signal composed of diffraction signals (e.g., zeroth order diffraction signal and a first order diffraction signal), from when the diffractive target 202 and illumination source 201 are stationary, and a processing unit 204 configured to derive a diffraction signal. The diffraction target 202 can be a diffraction-based overlay target, but other designs also can be used. The diffractive target 202 can be part of a semiconductor wafer. The measurement unit 203 may be configured to carry out the measurements in pupil plane 205 and/or in field plane 206.

In an instance, the illumination source 201 generates a beam of light with a wavelength from 400 nm to 800 nm (e.g., from 400 nm to 600 nm or 600 nm to 800 nm). The stage 211 is configured to hold the semiconductor wafer with the diffractive target 202 in the path of the beam of light. The beam of light from the illumination source 201 forms a spot on the semiconductor wafer with the diffractive target 202 having a diameter from 2 nm to 5 nm.

The illuminating may be coherent and the measuring may be carried out in pupil plane 205 (illustrated schematically) with respect to the diffraction target 202. The illumination wavelength and the pitch of the diffraction target 202 may be selected to yield partial overlapping of zeroth and first diffraction orders in the pupil plane 205.

The illuminating may be incoherent and the measuring may be carried out in field plane 206 (illustrated schematically) with respect to the diffraction target 202. The system 200 may further comprise a mask 207 at the pupil plane 205 of the diffraction target 202. The mask 207 can be configured to block a non-measured first order diffraction signal. The apodizer can be located at or proximate the pupil plane 205.

The measurement unit 203 can be configured to carry out the one or more measurements of a plurality of phases as the relations between diffraction signals (e.g., the zeroth and first diffraction signals). The measurement unit 203 can be further configured to carry out the repeated measurements of a plurality of angles and/or phases and/or wavelengths of the illumination to modify the relations between the diffraction signals. The system 200 may optionally include an optical phase scanner 212 (e.g., a digital light processing element, a tiltable mirror, a focus aberrating element, etc.) configured to carry out the repeated phase measurements. A reference beam 208 may be used in place of or in addition to zeroth order diffraction signal to enhance the measurement capabilities of the first diffraction signals as described herein. The system 200 can include a beam displacer 208 configured to modify an illumination beam incidence angle between the repeated measurements. Phase scanning can be replaced or enhanced by physically moving diffraction target 202, illumination source 201, and/or the measurement plane.

The system 100 can include an orders-separating optics 209 configured to separate field signals relating to different diffraction orders to be measured by respective at least two detectors 210, associated with measurement unit 203, for measuring the separated field signals. The detectors 126 may be part of measurement unit 203 in an instance. The combinations of zeroth order with ±1 first diffraction orders may be detected simultaneously on different detectors, 210 by using optics for separation of the orders. Such field plane detection has the advantage of simultaneous measurement of all the target cells.

The measurement unit 203 and/or processing unit 204 and the sub-systems therein can include a personal computer system, image computer, mainframe computer system, workstation, network appliance, internet appliance, or other device. The sub-system(s) or system(s) may also include any suitable processor known in the art, such as a parallel processor. In addition, the sub-system(s) or system(s) may include a platform with high speed processing and software, either as a standalone or a networked tool. While illustrated as separate units, the measurement unit 203 and/or processing unit 204 can be part of a single system.

In some embodiments, various steps, functions, and/or operations of the measurement unit 203 and/or processing unit 204 and the sub-systems therein and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor (or computer system) or, alternatively, multiple process (or multiple computer systems). Moreover, different sub-systems of the measurement unit 203 and/or processing unit 204 may include one or more computing or logic systems. Therefore, the above description should not be interpreted as a limitation on the present disclosure but merely an illustration.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method comprising:
   generating a beam of light with a wavelength from 400 nm to 800 nm, wherein the beam of light is used in on-axis illumination;
   directing the beam of light through an annular apodizer, wherein the annular apodizer is disposed proximate a pupil plane, and wherein the annular apodizer is configured to be used with the on-axis illumination; and
   performing overlay metrology on a semiconductor wafer using the beam of light, wherein the beam of light forms a spot on the semiconductor wafer having a diameter from 2 nm to 5 nm using the annular apodizer, wherein the semiconductor wafer includes a diffraction-based overlay target, and wherein the spot size is smaller than the diffraction-based overlay target.

2. The method of claim 1, wherein the annular apodizer defines an aperture with a numerical aperture of approximately 0.2.

3. The method of claim 1, wherein the wavelength is from 400 nm to 600 nm.

4. The method of claim 1, wherein the wavelength is from 600 nm to 800 nm.

5. The method of claim 1, wherein the metrology is performed in a field plane.

6. The method of claim 1, wherein the diffraction-based overlay target has dimensions of approximately 16 μm by 16 μm.

7. The method of claim 1, wherein the wavelength is a red wavelength.

8. The method of claim 1, wherein the beam of light is generated with a stationary illumination source, and wherein the semiconductor wafer is stationary.

9. The method of claim 1, wherein light from the beam of light is used for an edge of the pupil plane.

* * * * *